(12) United States Patent
Barezzani et al.

(10) Patent No.: US 11,378,599 B2
(45) Date of Patent: Jul. 5, 2022

(54) SYSTEM FOR SPIKING, I.E. EXPLORING VOLTAGE, IN ELECTRIC CABLES

(71) Applicant: Cembre S.p.A., Brescia (IT)

(72) Inventors: Gualtiero Barezzani, Brescia (IT); Leonardo Livi, Brescia (IT)

(73) Assignee: Cembre S.p.A., Brescia (IT)

( * ) Notice: Subject to any disclaimer, the term of this patent is extended or adjusted under 35 U.S.C. 154(b) by 30 days.

(21) Appl. No.: 17/049,510

(22) PCT Filed: May 17, 2019

(86) PCT No.: PCT/IB2019/054093
§ 371 (c)(1),
(2) Date: Oct. 21, 2020

(87) PCT Pub. No.: WO2019/220405
PCT Pub. Date: Nov. 21, 2019

(65) Prior Publication Data
US 2021/0255223 A1    Aug. 19, 2021

(30) Foreign Application Priority Data
May 17, 2018   (IT) .......................... 102018000005458

(51) Int. Cl.
*F15B 15/28* (2006.01)
*G01R 19/145* (2006.01)
*H01R 4/2406* (2018.01)

(52) U.S. Cl.
CPC ............ *G01R 19/145* (2013.01); *F15B 15/28* (2013.01); *H01R 4/2406* (2018.01); *F15B 2211/20515* (2013.01); *F15B 2211/50518* (2013.01); *H01R 2201/20* (2013.01)

(58) Field of Classification Search
CPC ................................ H02G 1/00; H02G 1/005
See application file for complete search history.

(56) References Cited

U.S. PATENT DOCUMENTS 4,760,327 A    7/1988  Walsh et al.
5,125,158 A *  6/1992  Casebolt ................ B26B 15/00
                                                          30/228

(Continued)

FOREIGN PATENT DOCUMENTS

WO    WO 2016/198973 A1    12/2016
WO    WO-2016198973 A1 *  12/2016  ........... B25B 27/146

*Primary Examiner* — Thomas E Lazo
(74) *Attorney, Agent, or Firm* — Blank Rome LLP

(57) ABSTRACT

A system (1) for spiking, i.e. exploring voltage, in electric cables (5) comprises a first clamping jaw (3) and a second clamping jaw (4) to lock a portion of an electric cable (5) in a clamping position (7), an elongated metal blade (8) which can be displaced between a retracted position and an extended position in the clamping position (7), a hydraulic actuator (9) to displace the blade (8), with respect to the first and second clamping jaws (3, 4), from the retracted position into the extended position, a pump (10) adapted to increase the pressure of a hydraulic liquid acting on the hydraulic actuator (9), a hand-held remote control (12) for remotely actuating and controlling the pump (10), wireless actuation communication means (13) adapted to provide pump actuation signals from the remote control (12) to the pump (10).

19 Claims, 7 Drawing Sheets

(56) References Cited

U.S. PATENT DOCUMENTS

| | | | |
|---|---|---|---|
| 5,447,450 A * | 9/1995 | Woodward | G01R 19/15 |
| | | | 439/417 |
| 6,296,501 B1 | 10/2001 | Ray et al. | |
| 7,240,490 B2 * | 7/2007 | Baumuller | B23D 15/14 |
| | | | 60/547.1 |
| 2006/0272381 A1 | 12/2006 | Ayer et al. | |
| 2008/0047363 A1 | 2/2008 | Arms et al. | |
| 2017/0157787 A1 * | 6/2017 | Skinner | G05B 19/042 |

* cited by examiner

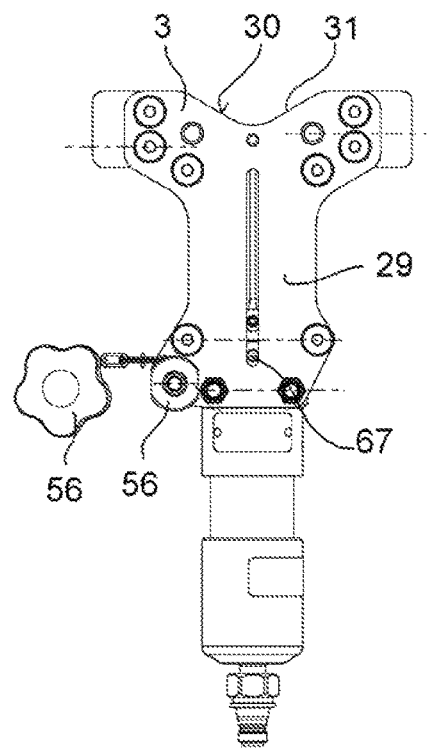
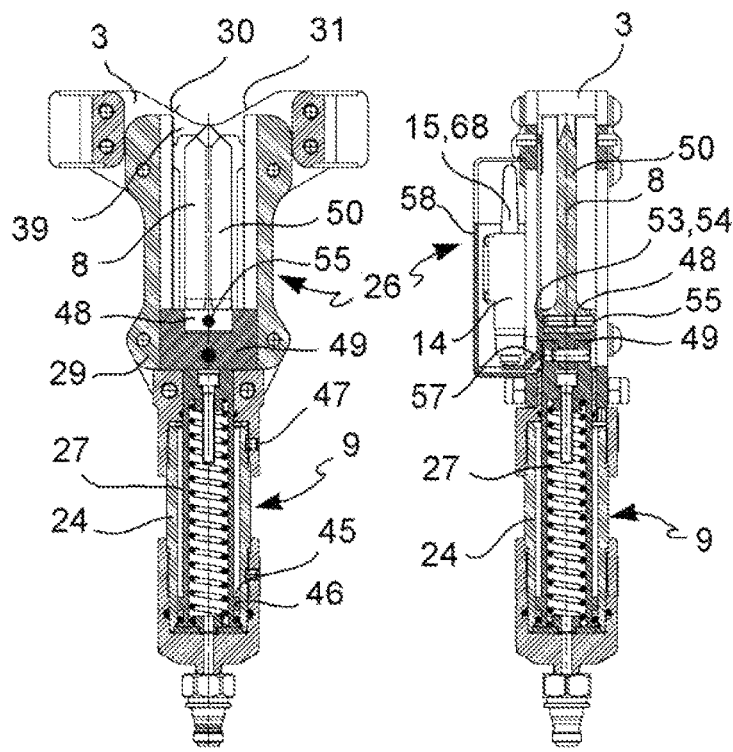
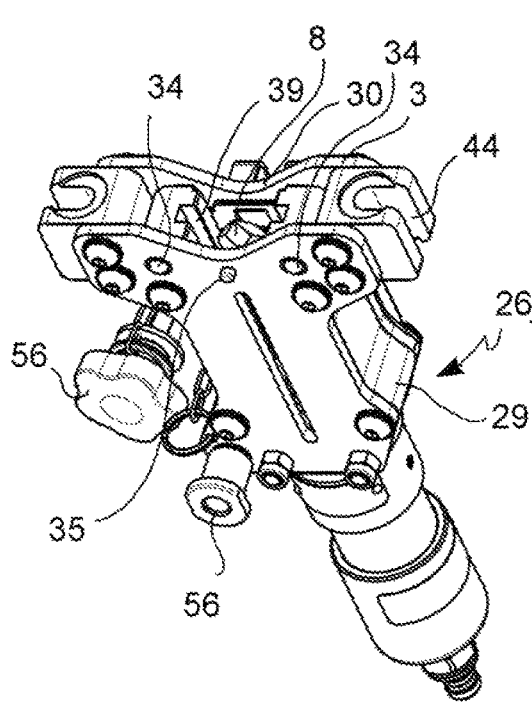
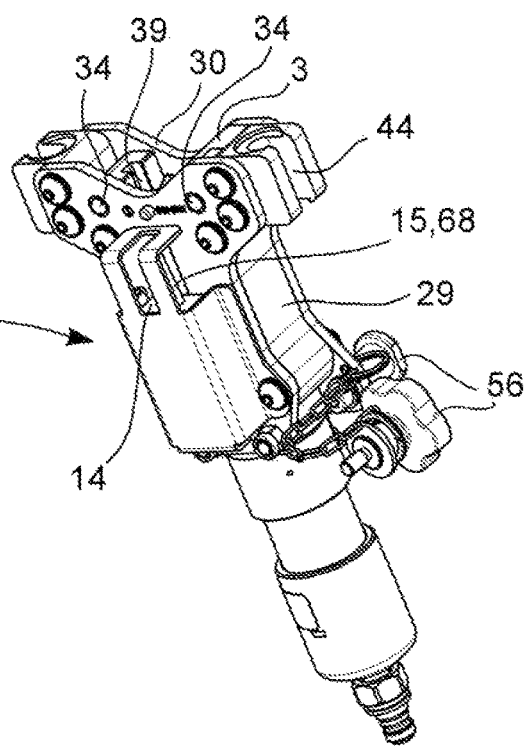
FIG. 4   FIG. 5   FIG. 6
FIG. 7   FIG. 8

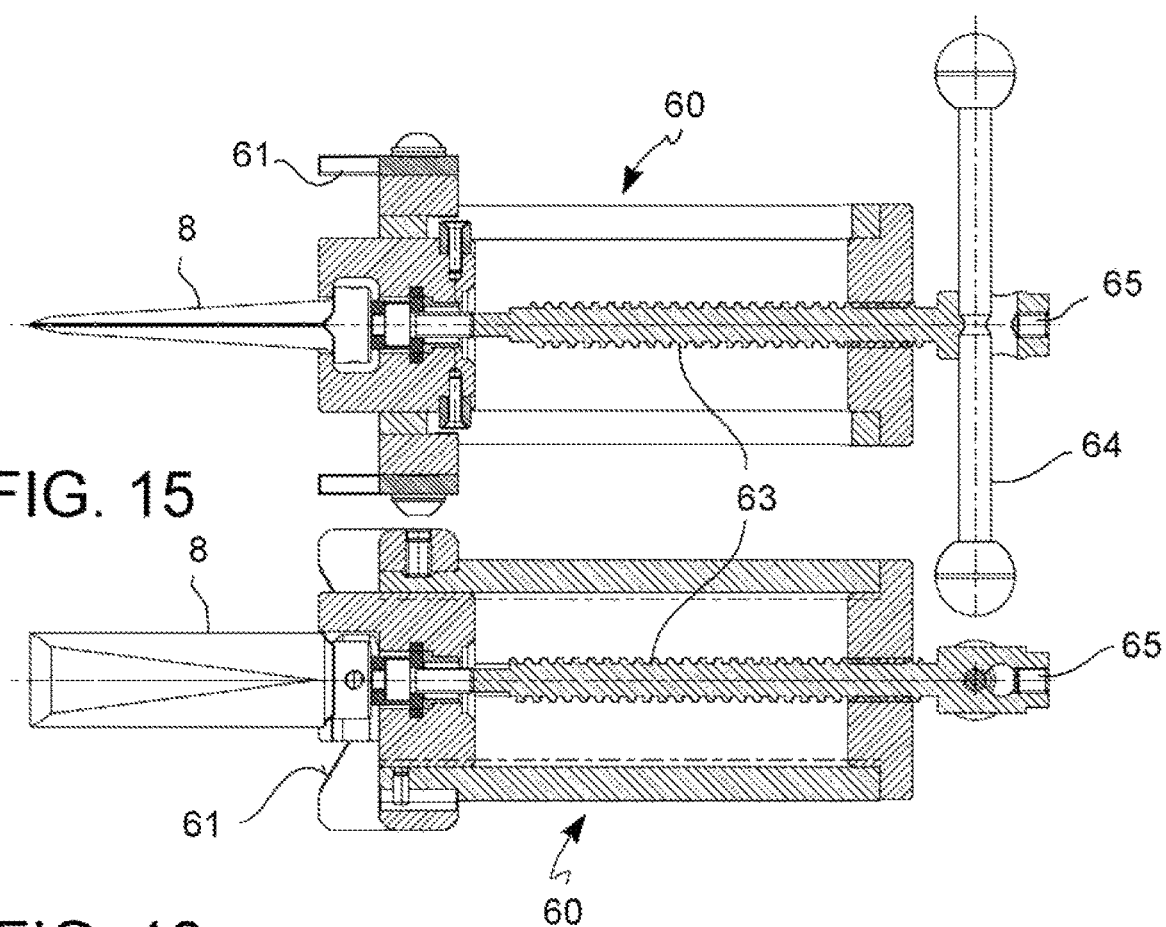
FIG. 15
FIG. 16
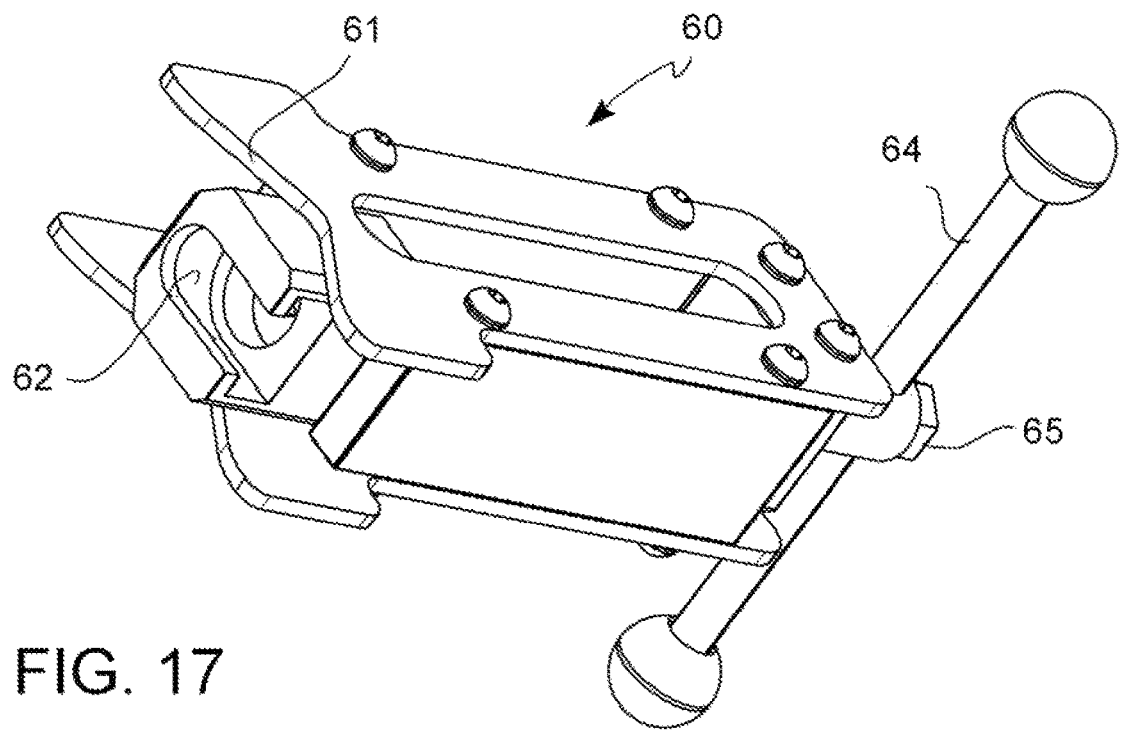
FIG. 17

SYSTEM FOR SPIKING, I.E. EXPLORING VOLTAGE, IN ELECTRIC CABLES

The present invention relates to a system for spiking, i.e. exploring voltage in electric cables.

When preparing for cutting or connection operations of electric cables, e.g. medium voltage cables, it is essential to explore the presence or absence of electric voltage in the cable.

The voltage exploration operation is usually performed by means of an exploring apparatus called "spike tool", which clamps a portion of externally isolated electric cable in a position which prevents a displacement of the single conductors of the cable, e.g. of the three individual conductors of a triplex, and which pushes a metal blade through the external insulation of the locked cable so as to put the individual conductors into electric contact with one another. If there is no voltage in the electric cable, the penetration of the metal blade into the cable has no effects except locally damaging the cable. If there is voltage in the electric cable, the penetration of the metal blade into the cable creates a short circuit and the formation of an electric arc which can be detected as an explosion.

A known voltage exploring apparatus comprises:
- two clamping jaws, shaped to receive a portion of an electric cable to be explored between each other,
- tightening means associated with the clamping jaws and adapted to allow an opening of the clamping jaws to receive the electric cable portion between each other and to tighten the clamping jaws against each other to clamp the electric cable portion in a clamping position,
- a metal blade connected to one of the jaws in displaceable manner between a retracted position, in which the blade does not interfere with the clamping position of the portion of electric cable, and an extended position, in which the blade extends through the clamping position of the portion of electric cable, so as to put individual conductors of the electric cable into electrical contact with one another,
- an explosive capsule associated with the metal blade, the explosion of which moves the blade from the retracted position into the extended position,
- a remote ignition device, connected by means of an ignition wire to the explosive capsule which can be actuated to explode the explosive capsule.

The known voltage exploring apparatuses allows, by virtue of the instantaneous effect of the explosion, an almost instantaneous (non-progressive) electric contact of the conductors of the explored electric cable. However, the need to store, transport and handle the explosive capsules is regarded as problematic and requires skilled and certified labor.

The exploration noise similar to a firearm shot and the explosion fumes are considered very annoying. Furthermore, after a limited number of explorations by detonation actuating, the exploring apparatus must be subjected to maintenance because of the destructive effect of the explosion on the blade and on the other components of the apparatus. Finally, the material connection of the operator with the electric cable during the voltage exploration, because of the ignition wire and the explosion of the explosive capsule itself are subjectively perceived as dangerous.

If the exploration operation shows no effect (presumably due to lack of electric voltage in the conductors) it is still necessary to check that the metal blade has truly penetrated in a complete manner through the electric cable. With the apparatus of the prior art, this verification requires a visual inspection of the position of the blade after the explosion of the explosive capsule and, hence, an approach of the operator to the cable damaged by the blade but without the absolute certainty that the exploration has been performed correctly and completely.

It is thus the object of the present invention to provide a system for spiking, i.e. exploring voltage in electric cables, having such features as to overcome at least some of the drawbacks mentioned with reference to the prior art.

These and other objects are achieved by means of a voltage exploring system according to claim 1. The dependent claims relate to advantageous embodiments.

According to an aspect of the invention, a system for spiking, i.e. exploring voltage in electric cables, comprises:
A) an exploring apparatus having:
- a first clamping jaw and a second clamping jaw, shaped to receive between each other a portion of an electric cable to be explored,
- a reversible tightening device associated with the clamping jaws and adapted to allow an opening of the clamping jaws to receive the electric cable portion between each other and to tighten the clamping jaws against each other to clamp the electric cable portion in a clamping position,
- an elongated metal blade connected to the first clamping jaw and which can be displaced between a retracted position, in which the blade does not interfere with the clamping position, and an extended position, in which the blade extends through the clamping position, so as to penetrate the electric cable portion and to put individual conductors of the electric cable into electric contact with one another,
- a hydraulic actuator connected to the first clamping jaw and configured to displace the blade, with respect to the first and second clamping jaws, from the retracted position into the extended position, in response to a pressure increase of a hydraulic liquid,
- a pump adapted to increase a pressure of a hydraulic liquid,
- a flexible pressure hose connected between the pump and the hydraulic actuator so as to communicate the hydraulic fluid pressure from the pump to the hydraulic actuator, the voltage exploring system further comprising:

B) a hand-held remote controller for remotely actuating and controlling the pump,
C) actuation communication means adapted to provide pump actuation signals from the remote controller to the pump, wherein:
- the hand-held remote controller is physically separate from the exploring apparatus and from any accessories physically connected thereto, so as to allow a positioning of the remote controller at a safe distance from the exploring apparatus,
- the actuation communication means comprise a wireless connection which exceeds said safety distance.

The provided exploring system avoids the need to hold, carry and handle explosive detonators, and the related risks, reduces acoustic and air pollution in the voltage exploration site and physically separates (electric isolation barrier) the exploring apparatus from the operator, thereby protecting the operator from any risk of electrocution and also overcoming the even only subjective perception of operating in condition of risk. Finally, the wireless transmission of commands for actuating the exploring apparatus allows the operator to be effectively sheltered from the exploration zone.

According to an advantageous aspect of the invention, the exploring apparatus further comprises:

a blade position detector connected to the first clamping jaw and configured to detect the arrival of the blade in the extended position and to provide a signal confirming the reaching of the extended position of the blade, exploring confirmation communication means connected to the position detector and adapted to transmit an exploring confirmation signal in dependency of the reaching of the extended position of the blade, wherein the exploring confirmation communication means comprise a wireless transmitter and/or contactless signaling means.

This allows the operator to obtain information on the completion of the voltage exploration, even before approaching the pump or the explored electric cable, in order to be able to proceed safely with the subsequent operations of extraction of the blade from the electric cable etc., as well as to be able to promptly interrupt the pressurization of the hydraulic liquid and in this manner reduce the consumption of energy (battery) and extend the life of the mechanically stressed components.

In order to better understand the invention and appreciate its advantages, the description of some exemplary, but not limiting, embodiments will be provided below with reference to the figures, in which:

FIG. 1 is a perspective view of a voltage exploring system according to an embodiment;

FIG. 2 is a perspective view of an exploring head of the voltage exploring system according to an embodiment, FIG. 3 is a longitudinal section view of the exploring head in FIG. 2, FIGS. 4, 5, 6 are side and longitudinal section views taken along two orthogonal section planes of the exploring head with a blade in retracted position and in which one of the clamping jaws is removed to improve visibility of internal parts, FIGS. 7 and 8 are perspective views of the exploring head of FIGS. 4, 5, 6, FIGS. 9, 10, 11 are views from the side and in longitudinal section taken along two orthogonal section planes of the exploring head with the blade in extracted position and in which one of the clamping jaws was removed to improve the visibility of internal parts, FIG. 12 is a perspective view of the exploring head in FIGS. 9, 10, 11, FIG. 13 is a perspective view of a second clamping jaw and of a clamping device of the jaws according to an embodiment, FIG. 14 is a perspective view of some adapters for a first clamping jaw according to an embodiment;

FIGS. 15 and 16 are longitudinal section views taken along two orthogonal section plans of a blade extraction device according to an embodiment;

FIG. 17 is a perspective view of the blade extraction device in FIG. 15;

Figure 1:
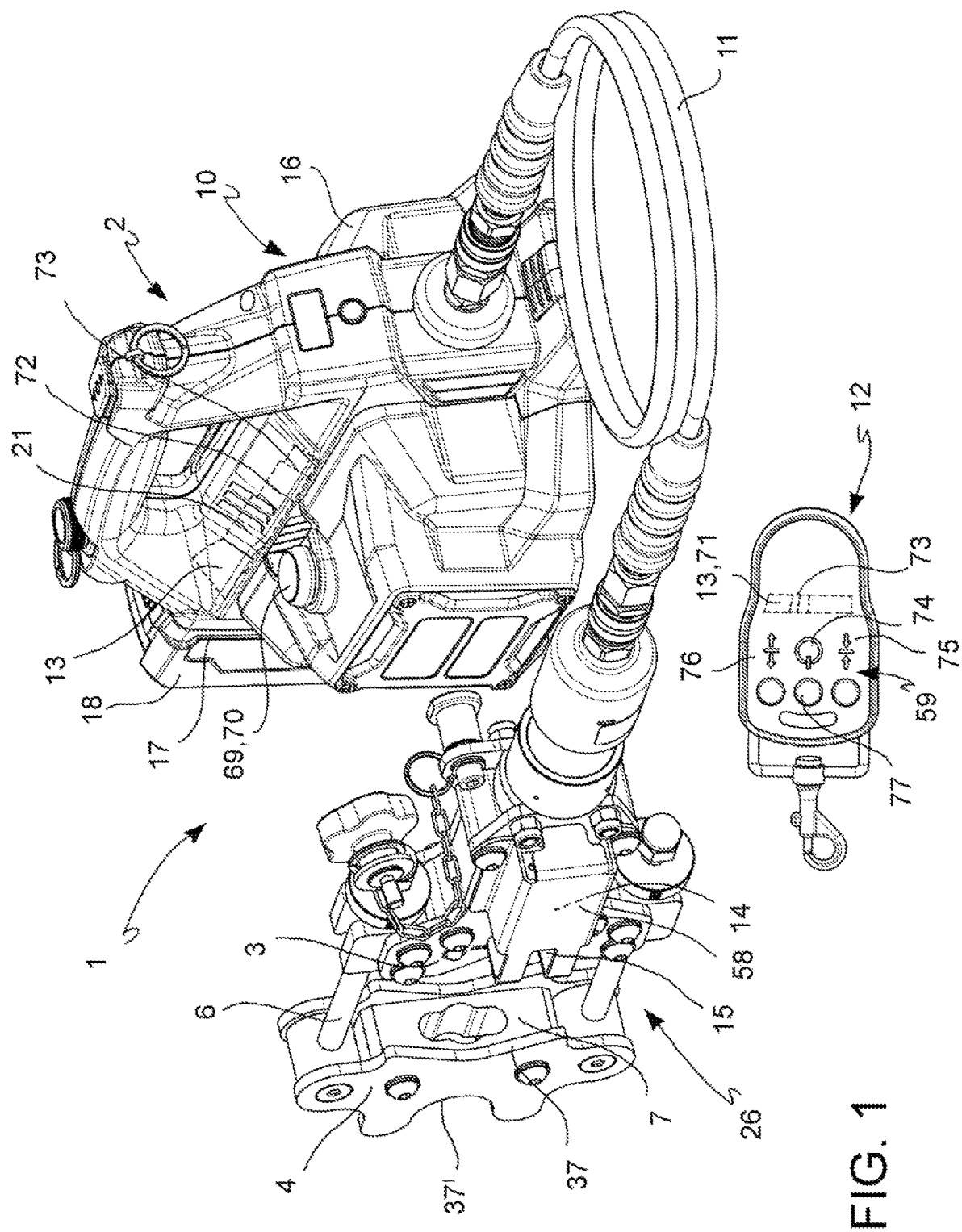

With reference to the figures, a system 1 for spiking, i.e. exploring voltage in electric cables comprises:
A) an exploring apparatus 2 having:

a first clamping jaw 3 and a second clamping jaw 4, shaped to receive between each other a portion of an electric cable 5 to be explored, a reversible tightening device 6 associated with the clamping jaws 3, 4 and adapted to allow an opening of the clamping jaws 4, 5 to receive the electric cable portion between each other and to tighten the clamping jaws 3, 4 against each other to clamp the electric cable portion 5 in a clamping position 7, an elongated metal blade 8 connected to the first clamping jaw 3 and which can be displaced between a retracted position, in which the blade 8 does not interfere with the clamping position 7, and an extended position, in which the blade 8 extends through the clamping position 7 so as to penetrate into the electric cable portion 5 and to put individual conductors of the electric cable into electrical contact with one another, a hydraulic actuator 9 connected to the first clamping jaw 3 and configured to displace the blade 8, with respect to the first and second clamping jaws 3, 4, from the retracted position into the extended position, in response to a pressure increase of a hydraulic fluid, an electro-hydraulic pump 10 adapted to increase the pressure of a hydraulic liquid, a flexible pressure hose 11 connected between the pump 10 and the hydraulic actuator 9 so as to communicate the hydraulic fluid pressure from the pump 10 to the hydraulic actuator 9, wherein the voltage exploring system 1 further comprises:

B) a hand-held remote controller 12 for a remote actuation and control of the pump 10, C) actuation communication means 13 adapted to provide pump actuation signals from the remote controller 12 to the pump 10, wherein:

the hand-held remote controller 12 is physically separate from the exploring apparatus 2 and from any accessories physically connected thereto, so as to allow a positioning of the remote controller 12 at a safe distance from the exploring apparatus 2, the actuation communication means 13 comprise a wireless connection 71, 72 exceeding said safe distance.

The exploring system 1 thus configured avoids the need to hold, carry and handle explosive detonators, and the related risks, reduces acoustic and air pollution in the voltage exploration site, and physically separates (electric isolation barrier) the exploring apparatus 2 from the operator, thereby protecting the operator from any risk of electrocution and also overcoming the even only subjective perception of operating in condition of risk. Finally, the wireless transmission of commands for actuating the exploring apparatus 2 allows the operator to be effectively sheltered from the exploration zone.

According to an embodiment, the exploring apparatus 2 further comprises:

a blade position detector 14 connected to the first clamping jaw 3 and configured to detect the arrival of the blade 8 in the extended position and to provide a signal confirming the reaching of the extended position of the blade 8, exploring confirmation communication means 15 connected to the position detector 14 and adapted to transmit a exploring confirmation signal according to the reaching of the extended position of the blade 8, wherein the exploring confirmation communication means 15 comprise a wireless transmitter 68 and/or contactless signaling means 69, 70 (e.g. acoustic or light).

This allows the operator to obtain information on the completion of the voltage exploration, even before approaching the pump 10 or the explored electric cable 5, in order to be able to proceed safely with the subsequent operations of extraction of the blade 8 from the electric cable 5 etc., as well as to be able to promptly interrupt the pressurization of the hydraulic fluid and in this manner reduce the consumption of energy (battery) and extend the life of the mechanically stressed components.

Detailed Description of the Pump 10

According to an embodiment, the pump 10 comprises:
- a pump housing 16,
- an accumulator seat 17, adapted to receive an accumulator 18 and having electric terminals which make an electric contact with the accumulator 18,
- an electric motor 19, supported by the pump housing 16, which can be supplied by the accumulator 18,
- a hydrodynamic assembly 20 (pumping assembly), supported by the pump housing 16 and connected to the electric motor 19 to increase the pressure of a hydraulic liquid in response to the movement of the electric motor 19,
- an electronic control circuit 21, connected to the electric motor 19 and to the accumulator 18 for controlling the electric motor 19.

The hydrodynamic pump 20 comprises a tank 22, a pumping cylinder-piston assembly and a maximum pressure valve 23.

The pumping cylinder-pump assembly may comprise a pumping cylinder with an intake opening connected to the tank 22 by means of a check valve, which allows the flow of hydraulic oil from the tank 22 into the pumping cylinder, and a discharge opening in communication with the pressure flexible tube 11 and, consequently, with an actuation cylinder 24 of the hydraulic actuator 9. A check valve is arranged in the discharge opening to allow the flow of hydraulic oil from the pumping cylinder towards the actuation cylinder 24, but not the other way. A pumping piston may be accommodated in the pumping cylinder and coupled so as to translate together with a pivoting member actuated by the electric motor 19.

The maximum pressure valve 23 may be arranged in a return duct 25 which connects the actuation cylinder 24 to the tank 22.

In this manner, the actuation of the electric motor 19 operates the hydrodynamic assembly 20 (pumping assembly) and moves the blade 8 from the retracted position towards the extended position until a predetermined maximum set pressure is reached in the actuation piston 24, e.g. 729 bar. When the maximum set pressure is reached, the maximum pressure valve 23 automatically opens the fluid return duct 25 to discharge (at least part of) the pressurized liquid from the actuation cylinder 24 into the tank 22.

According to an embodiment, the pump 10 comprises a pressure sensor 66 in signal connection with the electronic control circuit 21 and configured to detect the pressure of the hydraulic fluid acting on the hydraulic actuator 9.

The electronic control circuit 21 can be configured to automatically turn off the electric motor 19 dependent on the reaching of the maximum set pressure, namely dependent on the opening of the maximum pressure valve 23 and/or in dependency of a hydraulic fluid pressure detected by the pressure sensor 66 and/or in dependency of said exploration completion confirmation signal, i.e. upon arrival of the blade 8 in the extended position.

The pump 10 can comprise a connector, e.g. a connector with screw and nut, for a connection to ground. This protects the pump 10 from high voltage if live cables are cut (by mistake).

Detailed Description of the Exploring Head 26

The clamping jaws 3, 4, the hydraulic actuator 9, the clamping device 6 and the blade 8 are mutually connected or can be connected to form an exploring head 26 of the exploring apparatus 2.

The exploring head 26 may comprise a supporting structure 29 to which the actuation cylinder 24 of the hydraulic actuator 9 is connected or formed. The actuation cylinder 24 houses an actuation piston 27 which can be displaced by the pressure fluid from a rest position (corresponding to the retracted position of the blade 8) to an advanced position (corresponding to the extended position of the blade 8). A return spring 28 acts on the actuation piston 27 so as to elastically bias it to a rest position.

Figures 9, 10, 11:
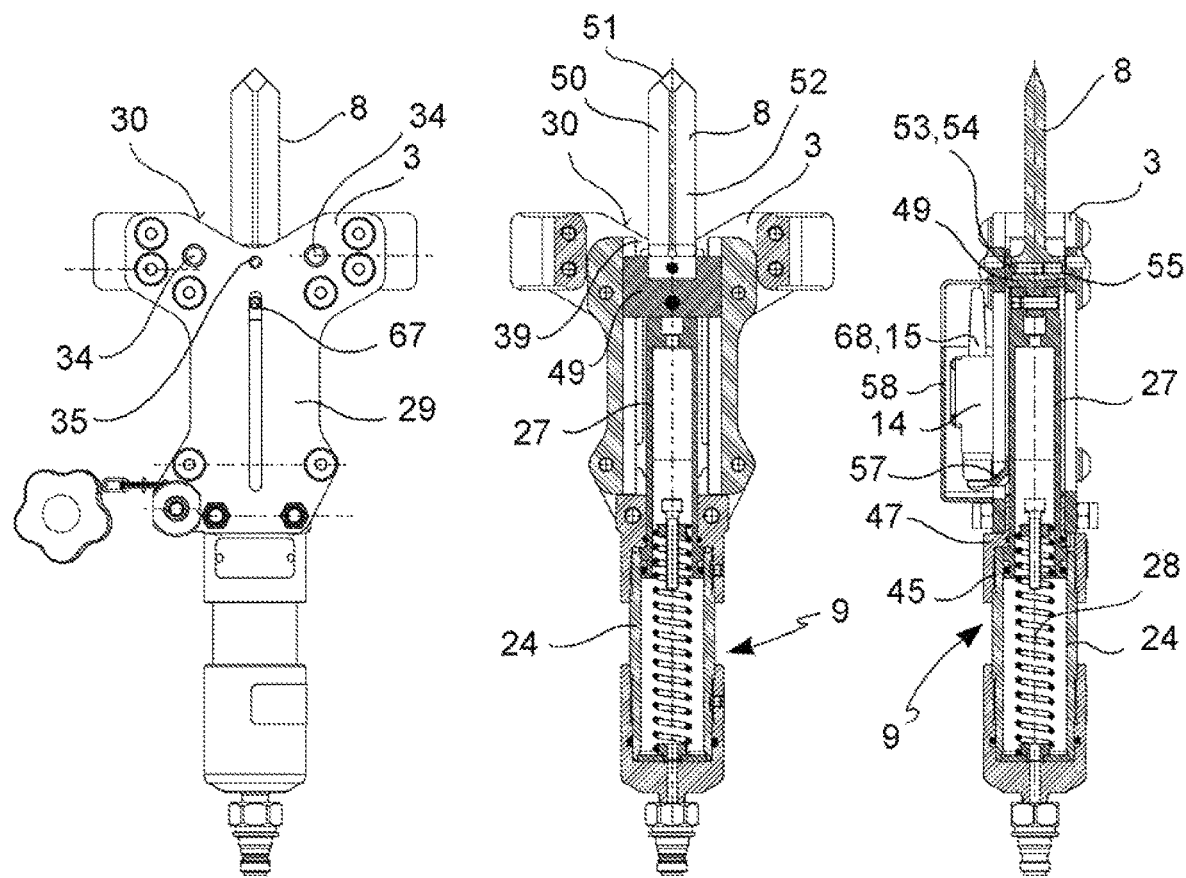
Figure 12:
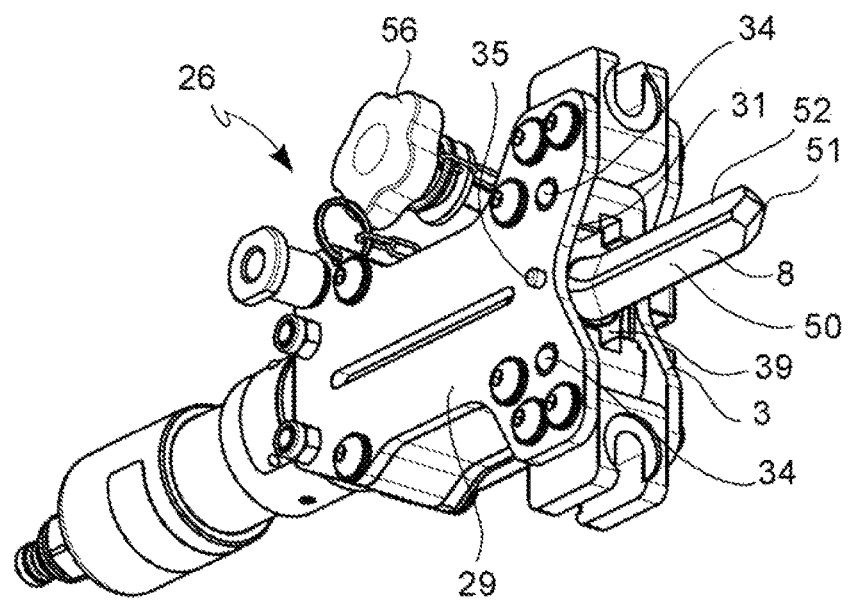

According to an embodiment (FIGS. 3, 10, 11), the actuation piston 27 forms an abutment surface 45, e.g. in an annular shoulder 46, which abuts against a stop surface 47 of the actuation cylinder 24 when the actuation piston 27 reaches the advanced position.

This defines a limit stop position of the actuation piston 27 at which, when reached, the pressure of the hydraulic fluid will increase rapidly until reaching the maximum set pressure which causes the opening of the maximum pressure valve 23.

The first clamping jaw 3 is connected to the supporting structure 29 or formed by the supporting structure 29 so as to be stationary with respect to the actuation cylinder 24 and forms a first cable seat 30 with at least one concavity to receive and retain the portion of electric cable 5 in the clamping position 7.

The first cable seat 30 can form a single concavity 31, e.g. chamfered "V"-shaped, to clamp only one electric cable with a single outer insulation, or it can form two adjacent concavities 31', 31", e.g. shaped as arcs of a circle, e.g. to clamp for a triplex electric cable with two or three individually isolated separate conductors.

The first clamping jaw 3 further forms a first passage channel 39 for the blade 8 to pass through the first clamping jaw 3 into the clamping position 7.

According to an embodiment, the first clamping jaw 3 comprises two steel plates, the front edges of which form the first cable seat 30, in which the two steel plates are mutually spaced apart by a gap or a spacer block which forms the first passage channel 39.

According to a further embodiment, the first cable seat 30 or a further first cable seat 30' is formed in an adapter 32 which can be reversibly clamped to a base portion 33 of the first clamping jaw 3.

The adapter 32 may also comprise two steel plates, the front edges of which form the first cable seat 30 or the further first cable seat 30', in which the two steel plates are mutually spaced apart by a gap or by means of a spacer lock which forms (at least part of) the first passage channel 39.

According to an embodiment, the reversible connection of the adapter 32 to the base portion of the first clamping jaw 3 is a snap-on connection, without the aid of tools. The snap-on connection may comprise a plurality of portions 34, e.g. balls, elastically supported in the base portion 33 of the first clamping jaw 3 and adapted to engage by snapping corresponding cavities 34' formed in the adapter 32, or vice versa, as well as a fixed centering projection 35 of base portion 33 which can be received in a corresponding centering cavity 36 of the adapter 32, said elements being preferably provided on two opposite sides of the adapter and of the jaw.

This allows an easy insertion by snapping and an easy manual removal of the adapter 32 from the base portion 33 of the first clamping jaw 3.

Figure 14:
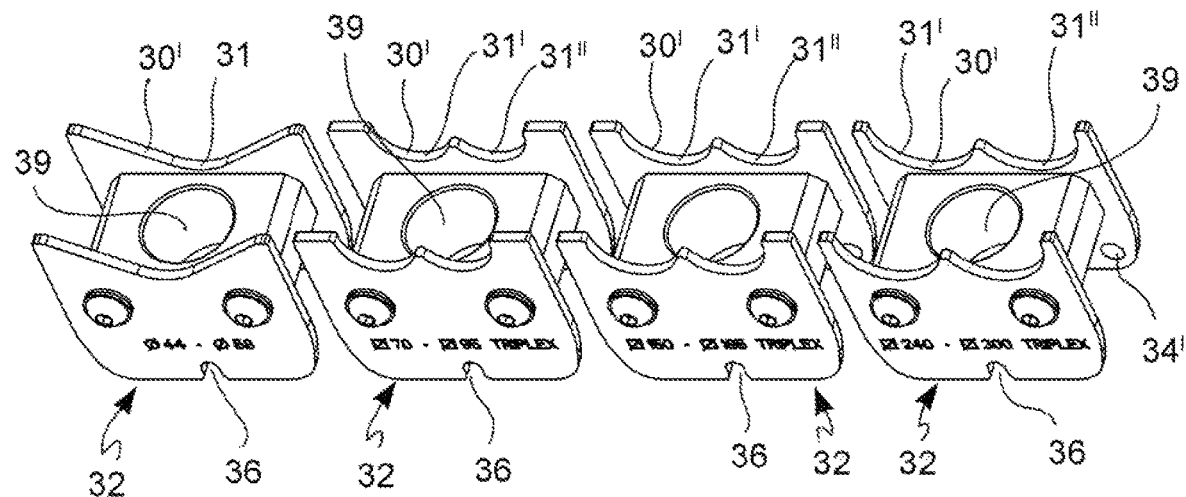
Figure 18:
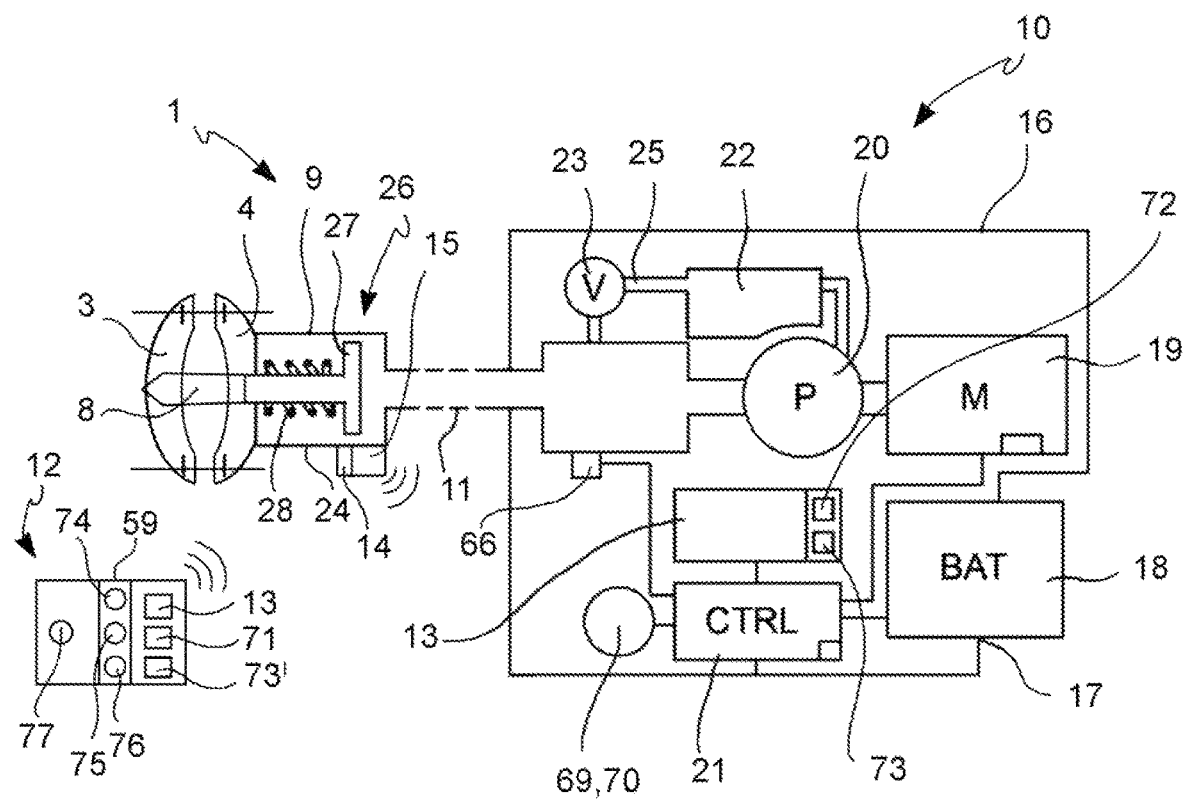
FIG. 18 is a diagrammatic view of functional assemblies of the system for exploring voltage according to an embodiment.

According to an embodiment, the exploring system 1 may comprise one or more of said different adapters 32 for electric cables 5 having different shapes and sections (FIG. 14).

Figures 2, 3:
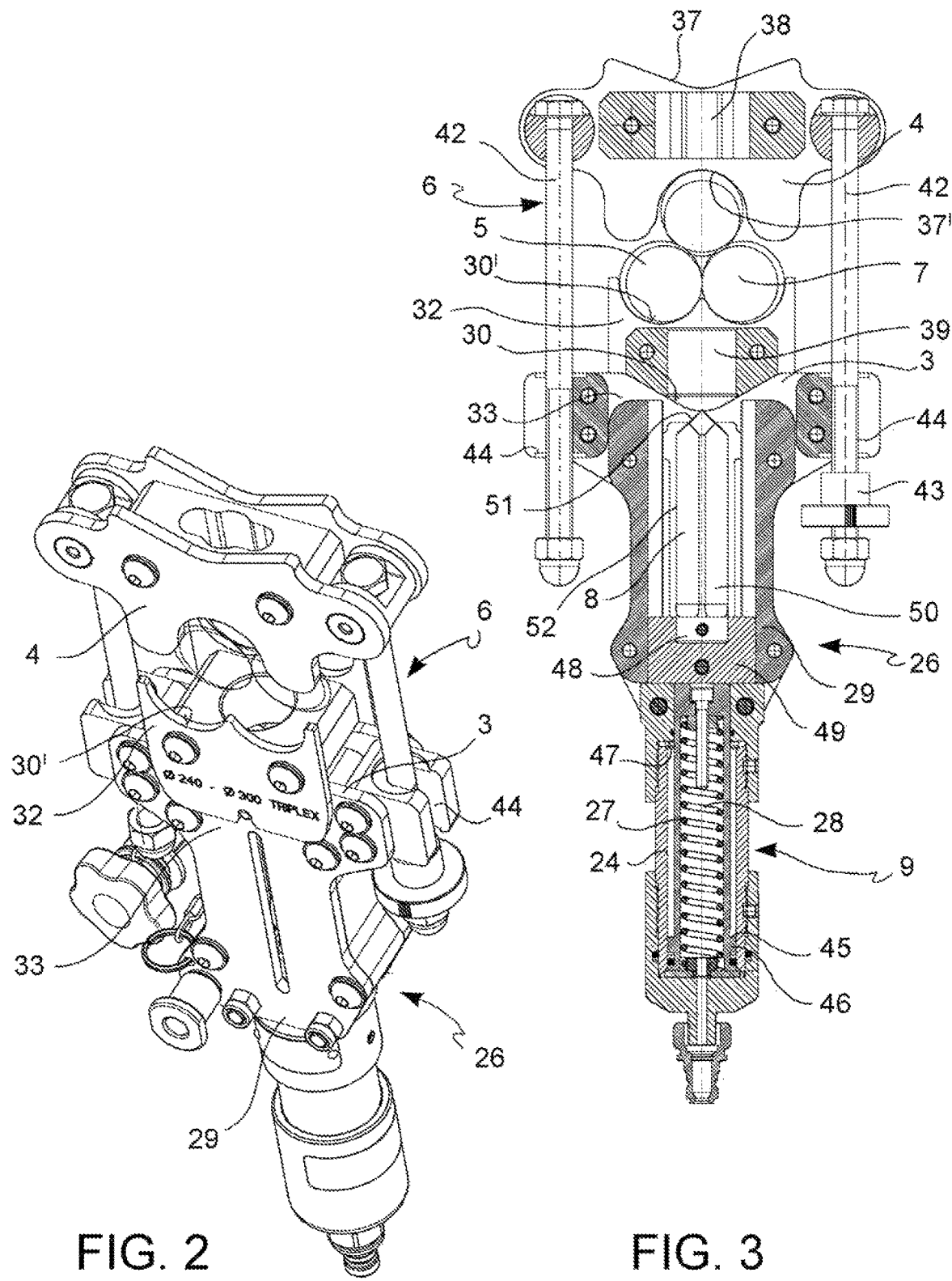

The second clamping jaw 4 is connected or can be connected to the supporting structure 29 by means of the aforesaid clamping device 6 and forms a second cable seat 37 with a concavity to accommodate and retain the electric cable portion 5 in the clamping position 7 (FIG. 3).

Figure 13:
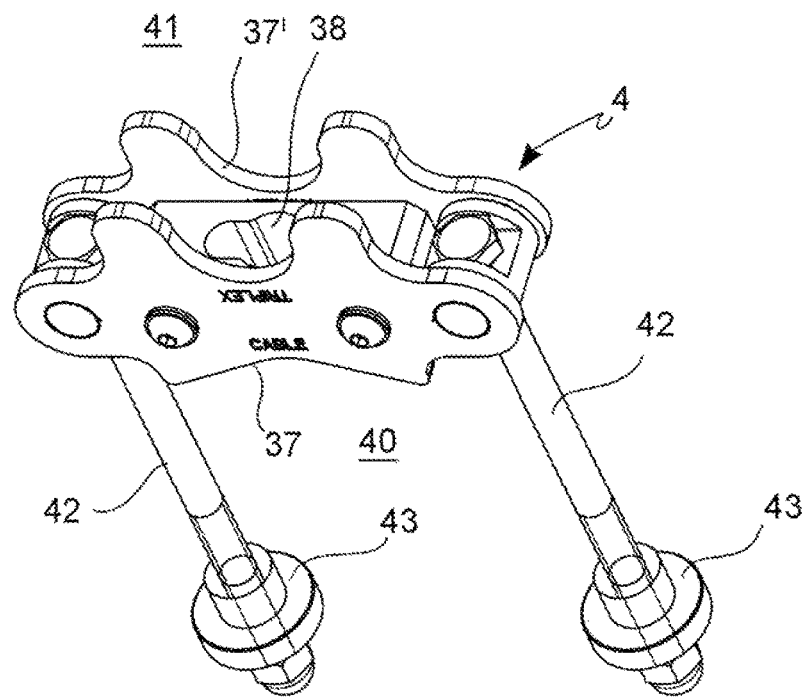

The second cable seat 37 forms a single concavity, e.g. chamfered "V"-shaped, to clamp an electric cable only with a single outer insulation, or it can be shaped as an arc of a circle, e.g. to clamp a triplex electric cable with two or three individually isolated separate conductors (FIGS. 3, 13).

The second clamping jaw 4 further forms a second passage channel 38 or a recess to allow the blade 8 to penetrate inside the second clamping jaw 4. This ensures a complete crossing of the electric cable 5 in the clamping position 7 by means of the blade 8.

According to an embodiment, the second clamping jaw 4 comprises two steel plates, the front edges of which form the second cable seat 3, in which the two steel plates are mutually spaced apart by a gap or spacer block which forms the first passage channel 39.

According to an embodiment, the second clamping jaw 4 forms a further second seat for cable 37', having a different shape from the shape of the second cable seat 37, in which the second clamping jaw 4 can be positioned and fastened with respect to the first clamping jaw 3 in two different positions. In a first position of the second clamping jaw 4, the second cable seat 37 directly faces the first clamping jaw 3 (FIG. 1). In a second position of the second clamping jaw 4, the further second cable seat 37' directly faces the first clamping jaw 3 (FIGS. 2, 3).

Advantageously, the second cable seat 37 is formed on a front side 40 of the second clamping jaw 4 and the further second cable seat 37' is formed on a rear side 41 of the second clamping jaw 4 opposite to the front side 40 (FIG. 13).

The tightening device 6 may comprise two traction bars 42 having first ends connected, preferably in articulated manner, to two side ends of the second clamping jaw 4 and second ends, threaded and equipped with a tightening nut 43, to engage corresponding tightening seats 44 of the supporting structure 29 (FIGS. 2, 3, 13) and for tightening the second clamping jaw 4 in the direction of the first clamping jaw 3.

By virtue of the articulated connection of the traction bars 42 to the second clamping jaw 4, the latter can be easily positioned and tightened in the first position thereof and in the second position thereof relative to the first clamping jaw 3.

The elongated blade 8 may comprise an elongated cutting portion 50 with a pointed and/or sharp free end 51 and, possibly, with sharp longitudinal edges 52, as well as a connecting portion 48 configured for a reversible connection of the blade 8 to the actuation piston 27 or to an intermediate connection 49 body, in turn connected to the actuation piston 27.

A snap-on connection device may be provided for the reversible connection of the blade 8. For example, the blade connection portion 48 may comprise one or more elastically displaceable stop projections 53 which engage in corresponding stop recesses 54 of the intermediate connection body 49 or of the actuation piston 27, or vice versa.

This allows not only an easy application of the blade 8 to the exploring head 26, but also an easy removal of the exploring head 26 from the blade 8 inserted in the electric cable 5.

In order to ensure a correct positioning of the blade 8 with respect to the actuation piston 27, the blade connecting portion 48 may comprise a further non-yielding protrusion 55, e.g. on the side opposite to the side of the elastically yielding stop projection 53. This further projection 55 can be provided, for example, with a grub screw which is screwed into the blade connecting portion 48.

Advantageously, the blade connecting portion 48 is enlarged with respect to the elongated cutting portion 50 so as to allow the blade connecting portion 48 to be gripped during an extraction of the blade 8 from the electric cable 5 following the completion of the voltage exploring operation.

According to an embodiment, the exploring apparatus 2 comprises a colored marking 67 visible on the outside of the exploring apparatus 2 and which moves either together with or according to the displacement of the actuation piston 27, thereby allowing a visual verification of the reaching of the extended position of the blade 8.

The exploring head 26 is removably connectible to the pressure pipe 11. Either alternatively or additionally, the pressure flexible tube 11 may be removably connected to the pump housing 16.

Advantageously, the flexible tube pressure 11 and the hydraulic liquid are electrically insulating and the hydraulic actuator 9 is electrically isolated from the pump 10. Furthermore, the supporting structure 29 of the exploring head 26 may comprise a connector 56, e.g. a connector with screw and nut, for a connection to ground.

Detailed Description of the Actuating Signal and Exploration Completed Signal Transmission System According to an embodiment, the actuation communication means 13 comprise an actuation transmitter 71 connected to, and preferably either mounted or housed on or in the remote controller 12, as well as an actuation receiver 72 connected to and preferably either mounted or housed on the pump 10, which together embody the aforesaid actuation wireless connection 71, 72.

The actuation transmitter 71 and the actuation receiver 72 are preferably wireless radio wave, or alternatively infrared radiation or laser, transmitters/receivers and/or transceivers.

The direct wireless transmission between the remote controller 12 and pump 10 is fast and requires a minimum number of transmission components.

According to an embodiment, the exploring confirmation communication means 15 comprise a (or the aforesaid) wireless exploring confirmation transmitter 68 connected to the blade position detector 14 and preferably mounted onto the first clamping jaw 3 or the exploring head 26, as well as a wireless exploring confirmation receiver 73 mounted or housed on the pump 10, which together form a wireless exploring confirmation connection.

According to an alternative or additional embodiment, the exploring confirmation communication means 15 comprise a (or the aforesaid) wireless exploring confirmation transmitter 68 connected to the blade position cutting detector 14 and preferably mounted on the first clamping jaw 3 or the exploring head 26, as well as an exploring confirmation receiver 73' connected to, and preferably either mounted or housed on or in the remote controller 12, which together constitute a wireless exploring confirmation connection.

A direct wireless transmission between the blade position detector 14 and the remote controller 12 or the pump 10 is fast and requires a minimum number of transmission components.

The exploring confirmation transmitter 68 and the exploring confirmation receiver 73, 73' are preferably radio wave, or alternatively infrared radiation or laser, transmitters/receivers and/or transceivers.

According to embodiments, the exploring confirmation communication means 15 may comprise optical indication means 70 and/or acoustic means 69 which are activated in dependency of the attainment of the extended position of the blade 8, e.g. in response to the receipt of the exploring confirmation signal so as to warn the operator.

The signaling means 69, 70 may comprise a light indicator, e.g. LED and/or an optical display 70 and/or an acoustic indicator 69, e.g. a beeper, arranged in the remote controller 12 (FIG. 1) and/or on the pump 10 and possibly visible/audible at a distance.

According to an embodiment, during the actuation of the pump 10, the light indicator and the acoustic buzzer emit an intermittent signal until the arrival of the blade 8 in the extended position. Upon arrival of the blade 8 in the extended position, the indicator light and the buzzer emit a continuous signal, e.g. in dependency of the exploring confirmation signal.

By virtue of the signaling means 69, 70, the operator may be immediately alerted that the voltage exploration has been completed and can proceed promptly with the successive step of working, in particular with the deactivation of the pump 10, without needing to leave their sheltered position distanced from the exploration region.

According to an advantageous embodiment, the exploration completion signal is also automatically transmitted to the control electronics 21 of the pump 10, which interrupts the pressurization of the pressure fluid (e.g. turns off the electric motor 19) in dependency of the exploration completion signal.

The electronic control unit 21 of the pump 10 can, for example, be configured to switch off the pump 10 automatically when two conditions occur simultaneously:
the blade 8 has reached the extended position,
the hydraulic fluid pressure, detected by means of the pressure sensor 66, exceeds a predetermined reference pressure.

Additionally, the electronic control unit 21 of the pump 10 interrupts the pressurization of the fluid pressure (e.g. shuts down the electric motor 19) in any case when the maximum set pressure is achieved which causes the opening of the maximum pressure valve 23 and/or which can be detected by the pressure sensor 66.

For this purpose, the electronic control unit 21 of the pump 10 may be in signal connection with the maximum pressure valve 23, e.g. with a microswitch associated with the maximum pressure valve 23, and/or with the pressure sensor 66.

A shutdown of the pump 10 depending on the reaching of the blade 8 in the extended position avoids an unnecessary further increase in the pressure of the hydraulic fluid, of the mechanical stress of the exploring head 26 and of the electric energy consumption of the battery, after the exploration being already completed, until reaching the maximum set pressure which causes the opening of the maximum pressure valve 23.

In less preferable manner, in embodiments in which the automatic shutdown of the pump 10 does not concern the pressure sensor 66 and/or the position detector blade 14, the electronic control unit 21 of the pump 10 can be configured to turn off the pump 10 automatically upon reaching the maximum set pressure which causes the opening of the maximum pressure valve 23.

According to embodiments, the exploring confirmation signal may be transmitted to the control electronics of the pump 10:
by the remote controller 12 by means of the actuation transmitter 71 (remote control side) and the actuation receiver 72 (pump side) and/or
by the exploring confirmation receiver 73 aboard the pump 10 and connected to the control circuit 21.

Either alternatively or additionally, a pumping interruption command may be transmitted to the control electronics 21 of the pump 10 by the operator, in non-automatic manner, by means of manual actuation (of a button) of the remote controller 12, and with the help of the actuation transmitter 71 (remote control side) and of the actuation receiver 72 (pump side).

The described transmitters and receivers are connected to the control electronics of the modules with which they are associated and can be controlled by the control electronics in a known manner and therefore not described in detail. Furthermore, the described transmitters and receivers can be separate devices and dedicated only to the described functions. This allows the use of wireless transmission systems, in particular radio transmission systems, commercially available at low cost and optimized for certain functions.

For example, the blade position detector 14 and the exploring confirmation transmitter 73 can be embodied by a push-switch sensor equipped with a radio transmitter for the confirmation of the pushing of the button and with a dedicated radio receiver, of small size and low costs.

Alternatively, the described transmitters and receivers can be made by more versatile transmitters, receivers or transceivers which perform a plurality of the described wireless transmission and reception features.

Detailed Description of the Blade Position Detector 14

The blade position detector 14 is connected to the exploring head 26, in particular to the actuation cylinder 24, so as to detect the arrival of the blade 8 in the extended position or the arrival of the actuation piston 27 in the limit stop position (forward position). The blade position detector 14 may comprise an electromechanical sensor, e.g. a position switch, an optical switch, a magnetic proximity sensor, contact sensor or a potentiometer.

Advantageously, the blade position detector 14 comprises a movable member 57, which is displaced either directly or indirectly by the actuating piston 27 when the closed position of the jaws 8 is reached and a part of the displacement energy of the movable member 57 is used to energize and actuate the exploring confirmation transmitter 68. Preferably, a further part of the displacement energy of the movable member 57 is accumulated for the reception, by the exploring confirmation transmitter 68, of a confirmation signal (from the exploring confirmation receiver 73, 73') that the first exploration configuration signal was received and, in the negative case, to repeat the transmission of the exploration confirmation signal.

The need for an electric battery for the blade position detector 14 and for the exploring confirmation transmitter 68 is avoided in this manner. Indeed, according to an advantageous embodiment, the blade position detector 14 and the exploring confirmation transmitter 68 are both battery-free.

In this embodiment, the exploring confirmation transmitter 68 and the exploring confirmation receiver 73, 73' are configured as transceivers.

Advantageously, the blade position detector 14 and the exploring confirmation transmitter 68 are accommodated in and protected by a protective housing 58, preferably made of sheet metal.

Detailed Description of the Blade Extraction Device 60

According to a further embodiment (FIGS. 15,16,17), the voltage exploring system 1 further comprises an extraction blade device 60, comprising:

a resting seat 61 shaped for the resting against the electric cable 5, a shaped blade hooking portion 62 (e.g. provided with an undercut) for a shape connection with (the blade connection portion 48 of) the blade 8, said blade hooking portion 62 being guided in a displaceable manner with respect to the resting seat 61, as well as a traction mechanism 63 connected to the resting seat 61 and acting on the blade hooking portion 62 to drag the blade hooking portion 62 from a first position at the resting seat 61 towards a second position away from the resting seat 62 so as to extract the blade 8 hooked to the blade hooking portion 62 out of the electric cable 5.

In an embodiment, the traction mechanism 63 comprises a nut and screw mechanism which can be actuated manually by a lever or handle 64.

According to an alternative or additional embodiment, the traction mechanism 63 comprises a tool coupling seat 65, e.g. a hexagonal seat, for coupling a screwdriver to actuate the traction mechanism 63 and extract the blade 8.

As an alternative to a blade extraction device 60, the hydraulic actuator 9 may be configured as a double-acting hydraulic actuator and the blade 8 may be coupled to the double-acting hydraulic actuator 9 so as to transmit both compression and traction to the blade 8 and to be able to not only insert the blade 8 into the electric cable 5 but also to extract it from the latter by means of the hydraulic actuator 9.

Detailed Description of the Hand-Held Remote Controller 12

The hand-held remote controller 12 comprises a switch port 59 for manually switching on and off (the electric motor 19 of) the pump 10.

In an embodiment, the switch board 59 also allows the manual selection of an operating mode of the pump 10 from a plurality of preset operating modes, and the hand-held remote controller 12 may comprise a display which shows the selected operating mode and/or the operating parameters and/or information on the exploration execution state.

The remote controller 12 is in signal connection with the pump 10 by means of a wireless actuation transmitter 71 aboard the remote controller 12 and the actuation receiver 72 aboard the pump 10 and connected to the control electronics 21 of the pump 10.

According to an embodiment, the hand-held remote controller 12 comprises an ON/OFF button 74 of the remote controller 12, a pumping button 75 to actuate the pump 10, a release button 76 to switch off the pump 10 and to release the hydraulic fluid pressure, thereby allowing the return of hydraulic liquid into the tank 22 of the pump 10.

The hand-held remote controller 12 further comprises a light indicator 77 to indicate the switching ON state and the battery state of the remote controller 12.

The invention claimed is:

1. A system for "spiking", i.e. exploring voltage, in electric cables, comprising:

A) an exploring apparatus having:
   a first clamping jaw and a second clamping jaw, shaped to receive therebetween a portion of an electric cable to be explored,
   a reversible tightening device associated with the clamping jaws and adapted to allow an opening of the clamping jaws to receive the electric cable portion therebetween and to tighten the clamping jaws one against the other to clamp the electric cable portion in a clamping position,
   an elongated metal blade connected to the first clamping jaw and displaceable between a retracted position, in which the blade does not interfere with the clamping position, and an extended position, in which the blade extends into the clamping position, so as to penetrate the electric cable portion and to put individual conductors of the electric cable in electrical contact with one another,
   a hydraulic actuator connected to the first clamping jaw and configured to displace the blade, with respect to the first and second clamping jaws, from the retracted position into the extended position, in response to a pressure increase of a hydraulic liquid,
   a pump adapted to increase a pressure of a hydraulic liquid,
   a flexible pressure hose connected between the pump and the hydraulic actuator so as to communicate the hydraulic liquid pressure from the pump to the hydraulic actuator,
   a blade position detector connected to the first clamping jaw and configured to detect the arrival of the blade into the extended position and to provide an exploring confirmation signal confirming the reaching of the extended position of the blade, wherein the blade position detector comprises a movable member, directly or indirectly displaceable by means of an actuation piston of the hydraulic actuator so as to actuate, upon reaching the extended position of the blade, a pressure button of a pressure detector to generate the exploring confirmation signal, and
   exploring confirmation communication means connected to the position detector and comprising an exploring confirmation transmitter adapted to transmit the exploring confirmation signal, wherein a part of the displacement energy of the movable member of the blade position detector is used to power and actuate the exploring confirmation transmitter, and wherein the exploring confirmation transmitter is a wireless transmitter,
wherein the blade position detector and the wireless transmitter of the exploring confirmation communication means are both battery-free, and
wherein the voltage exploring system further comprises:
B) a manual remote controller for a remote actuation and control of the pump,
C) actuation communication means adapted to provide pump actuation signals from the remote controller to the pump,
wherein:
   the manual remote controller is physically separate from the exploring apparatus and from any accessories physically connected thereto, so as to allow a positioning of the remote controller at a safety distance from the exploring apparatus, and
   the actuation communication means comprise a wireless connection exceeding said safety distance.

2. A system according to claim 1, comprising sound and/or light signaling means signaling the arrival of the blade in the extended position.

3. A system according to claim 1, wherein the electronic control circuit is configured to automatically switch off the motor depending on the exploring confirmation signal.

4. A system according to claim 1, wherein the exploring confirmation communication means comprises the wireless exploring confirmation transmitter connected to the blade position detector and mounted to the first clamping jaw, as well as a wireless exploring confirmation receiver mounted and connected to the pump, which together make a wireless exploring confirmation connection, wherein said exploring confirmation transmitter and said exploring confirmation receiver are selected from the group consisting of radio wave, infrared radiation and laser transmitters/receivers and transceivers.

5. A system according to claim 1, wherein the pump comprises:
   a pump housing,
   a motor supported by the pump housing,
   a pumping unit supported by the pump housing and connected to the motor so as to increase, in response to the movement of the motor, the hydraulic liquid pressure,
   an electronic control circuit connected to the motor to control the motor,
   a maximum pressure valve which, upon reaching a maximum set pressure in the hydraulic fluid acting on the hydraulic actuator, automatically opens a return duct from the hydraulic actuator to a tank of the pump to discharge at least part of the pressure fluid into the tank, and
   a pressure sensor in signal connection with the electronic control circuit and configured to detect the hydraulic liquid pressure.

6. A system according to claim 5, wherein the electronic control circuit is configured to automatically switch off the motor depending on:
   the reaching of the maximum set pressure of the hydraulic fluid, and/or
   a hydraulic fluid pressure detected by means of the pressure sensor.

7. A system according to claim 6, wherein the control electronics of the pump is configured to switch off the pump automatically when the following two conditions simultaneously occur:
   the blade has reached the extended position,
   the hydraulic fluid pressure, detected by means of the pressure sensor, exceeds a predetermined reference pressure.

8. A system according to claim 1, wherein the clamping jaws, the hydraulic actuator, the tightening device and the blade are connected to a supporting structure and together form an exploring head of the exploring apparatus positioned at a variable distance from the pump.

9. A system according to claim 1, wherein the first clamping jaw is connected in a stationary manner with respect to an actuation cylinder of the hydraulic actuator and forms:
   a first cable seat with at least one concavity to accommodate and hold the electric cable portion in the clamping position,
   a first passage channel for the blade to pass through the first clamping jaw into the clamping position.

10. A system according to claim 9, wherein the first cable seat or a further first cable seat is formed in an adapter reversibly lockable to a base portion of the first clamping jaw.

11. A system according to claim 10, wherein the reversible connection of the adapter is a snap connection, without the aid of tools, comprising a plurality of spherical portions, elastically supported in the base portion of the first clamping jaw and adapted to snap-engage corresponding cavities formed in the adapter, or vice versa, and at least one fixed centering projection of the base portion receivable in a corresponding centering cavity of the adapter,
   wherein the exploring system comprises one or more of said different adapters for electric cables having different shapes and sections.

12. A system according to claim 1, wherein the second clamping jaw forms:
   a second cable seat with a concavity to accommodate and hold the electric cable portion in the clamping position,
   a second passage channel or a recess to allow the blade to penetrate inside the second clamping jaw,
   a further second cable seat, having a shape different from the shape of the second cable seat,
   wherein the second clamping jaw may be positioned and tightened with respect to the first clamping jaw in:
   a first position in which the second cable seat faces the first clamping jaw,
   a second position in which the further second cable seat faces the first clamping jaw.

13. A system according to claim 1, wherein the tightening device comprises two traction bars having first ends connected in an articulated manner to two side ends of the second clamping jaw and second ends, threaded and equipped with a tightening nut, for engaging with corresponding tightening seats of the first clamping jaw to tighten the second clamping jaw in the direction of the first clamping jaw.

14. A system according to claim 1, wherein the elongated blade comprises an elongated cutting portion with a sharp free end and with sharp longitudinal edges, as well as a connecting portion configured for a reversible snap-connection of the blade to the hydraulic actuator.

15. A system according to claim 14, wherein the blade connecting portion is enlarged with respect to the elongated cutting portion, so as to allow the blade connecting portion to be gripped during an extraction of the blade from the electric cable following the completion of the voltage exploring.

16. A system according to claim 1, wherein the exploring apparatus comprises a colored marking visible outside the exploring apparatus and moving together with the displacement of the actuation piston of the hydraulic actuator.

17. A system according to claim 1, wherein the actuation communication means comprise an actuation transmitter, connected and mounted to the remote controller, as well as an actuation receiver, connected and mounted to the pump and which provide together said wireless actuation connection, said actuation transmitter and said actuation receiver being selected from the group consisting of radio wave, infrared radiation and laser transmitters/receivers and transceivers.

18. A system according to claim 1, further comprises a blade extraction device, comprising:
   a resting seat shaped for the resting against the electric cable, a blade hooking portion shaped to engage the blade in a shape connection, said blade hooking portion being guided in a displaceable manner with respect to the resting seat, a traction mechanism connected to the resting seat and acting on the blade hooking portion to drag the blade hooking portion from a first position at the resting seat towards a second position away from the resting seat so as to extract the blade hooked to the blade hooking portion out of the electric cable.

19. A system according to claim 1, wherein the manual remote controller comprises an ON/OFF button of the remote controller, a pumping button to actuate the pump, a release button to switch off the pump and to release the hydraulic fluid pressure, as well as a light indicator to indicate the switch on status and the battery status of the remote controller.

\* \* \* \* \*